United States Patent [19]

Taylor

[11] Patent Number: 4,774,478

[45] Date of Patent: Sep. 27, 1988

[54] FEEDBACK AMPLIFIER COMPENSATION CIRCUITRY

[75] Inventor: Stewart S. Taylor, Beaverton, Oreg.

[73] Assignee: Tektronix, Inc., Beaverton, Oreg.

[21] Appl. No.: 909,654

[22] Filed: Sep. 19, 1986

[51] Int. Cl.[4] .............................................. H03F 1/34
[52] U.S. Cl. .................................... 330/294; 330/151
[58] Field of Search ............... 330/107, 151, 260, 293, 330/294

[56] References Cited

U.S. PATENT DOCUMENTS 4,484,148 11/1984 Wieser et al. ................... 330/294 X Primary Examiner—James B. Mullins
Attorney, Agent, or Firm—William S. Lovell; Paul S. Angello

[57] ABSTRACT

A frequency-compensated transistor feedback amplifier provides relatively wide bandwidth and relatively large phase and gain margins, irrespective of the transconductance of the transistors in the amplifier. Each one of three preferred embodiments (10, 50, 104) of the invention includes a transconductance stage (20, 68, 68) and an amplifier stage (12 and 14, 54, 54 and 14). The transconductance stage delivers an input signal to the amplifier stage, which produces an amplified replica of the input signal. A feedback capacitor (24, 88, 24 and 88) connected between the output and the input of the amplifier stage provides dominant pole compensation by which the magnitude of the loop gain diminishes by 6 dB/octave with increasing frequency. The capacitor provides a forward feedthrough path for any residual portion of the input signal so that the residual portion arrives at the output of the amplifier stage in substantially the same phase relation with that of the output signal of intermediate frequency. This invention can be implemented in circuitry whose input signal is taken from a transconductance stage that comprises an amplifier configured in either a single-ended output mode or a double-ended output mode.

14 Claims, 2 Drawing Sheets

FEEDBACK AMPLIFIER COMPENSATION CIRCUITRY

BACKGROUND OF THE INVENTION

The present invention relates to feedback amplifiers and, in particular, to a feedback amplifier that employs compensation circuitry which provides an amplifier with relatively wide bandwidth and relatively large gain and phase margins.

There are two common measures of stability of a feedback amplifier, which measures include gain margin and phase margin. Gain margin is defined to be the magnitude in decibels of the loop gain of the amplifier for the frequency at which the phase of the loop gain equals $-180°$. The magnitude of the loop gain at this frequency is usually required to be less than 0 dB for stability. Phase margin is defined to be the sum of $180°$ and the phase of the loop gain for the frequency at which the magnitude of the loop gain is unity. The phase margin at this frequency is usually required to be greater than $0°$ for stability.

Compensation is the method by which one ensures that a feedback amplifier is stable. Dominant pole compensation is the most common method of compensation and entails the reduction of open loop amplifier bandwidth by deliberately introducing a dominant pole at a predetermined frequency into the amplifier transfer function to force the magnitude of the loop gain to unity before the phase shift increases (i.e., becomes more negative) to $-180°$ beyond its low frequency value. The frequency at which the magnitude of the loop gain is unity is denoted as "$f_{unity}$." One technique for implementing dominant pole compensation is Miller compensation, which involves a direct sacrifice of amplifier open loop bandwidth for stability.

Miller compensation of a common-emitter bipolar transistor amplifier entails the positioning of a feedback capacitor of value $C_M$ between the collector and base terminals of the transistor. The capacitor $C_M$ introduces a dominant pole at a sufficiently low frequency into the amplifier transfer function to provide a stable feedback amplifier with adequate gain and phase margins. The Miller compensation capacitor has been found in some cases to reduce the phase margin and/or gain margin of an amplifier at relatively high frequencies. This can cause, inter alia, "preshoot" in the step response of the amplifier.

Equivalently, Miller compensation can create a right half plane zero in the amplifier transfer function. The right half plane zero appears approximately at a frequency $f_z = g_m/2\pi C_M$, where $g_m$ is the transconductance of the transistor. The existence of a right half plane zero is undesirable in the gain function of an amplifier because a right half plane zero simultaneously increases the magnitude and phase shift (i.e., the phase shift becomes more negative) of the loop gain with increasing frequency. The presence of a right half plane zero is undesirable because it makes the task of compensation difficult or impossible.

One way of minimizing the adverse effects of a right half plane zero is to select a transistor topology, device type, and operating point combination that produces a large transconductance. This solution is, of course, not available for a transistor amplifier whose transconductance is inadequate to position the right half plane zero at a frequency that is much larger than $f_{unity}$ (e.g., typically at least five times $f_{unity}$).

SUMMARY OF THE INVENTION

An object of the present invention is, therefore, to provide a feedback amplifier that employs compensation circuitry for stability.

Another object of the invention is to provide such an amplifier that has a relatively wide bandwidth and relatively large gain and phase margins.

A further object of the invention is to provide such an amplifier that employs dominant pole compensation for intermediate frequencies and eliminates preshoot in the step response of the amplifier.

Still another object of the invention is to provide such an amplifier that employs compensation circuitry that prevents the introduction of a right half plane zero into the amplifier transfer function, irrespective of the amplifier transconductance value.

The present invention is a frequency-compensated feedback amplifier that overcomes the problems associated with Miller compensation. There are three preferred embodiments disclosed herein, each of which includes a transconductance stage and an amplifier stage. The transconductance stage delivers an input signal to the amplifier stage, which produces an output signal that is an amplified replica of the input signal. A feedback capacitor connected between the output and the input of the amplifier stage provides negative feedback for intermediate frequencies and thereby provides dominant pole compensation by which the magnitude of the loop gain diminishes by 6 dB/octave with increasing frequency. The capacitor is positioned between the output and the input of the amplifier stage in a manner that provides a forward feedthrough path for any residual portion of the input signal so that the residual portion arrives at the output in substantially the same phase relation with that of the intended output signal. This provides an amplifier with relatively wide bandwidth and relatively large phase and gain margins, irrespective of the transconductance of the transistor amplifier.

The present invention can be implemented in circuitry whose input signal is taken from a transconductance stage that comprises an amplifier configured in either a single-ended output mode or a double-ended (i.e., differential) output mode. The invention also can be implemented readily as part of an integrated circuit.

Additional objects and advantages of the present invention will be apparent from the following detailed description of preferred embodiments thereof which proceeds with reference to the accompanying drawings.

DETAILED DESCRIPTION OF THE PREFERRED EMBODIMENTS

Figure 1:
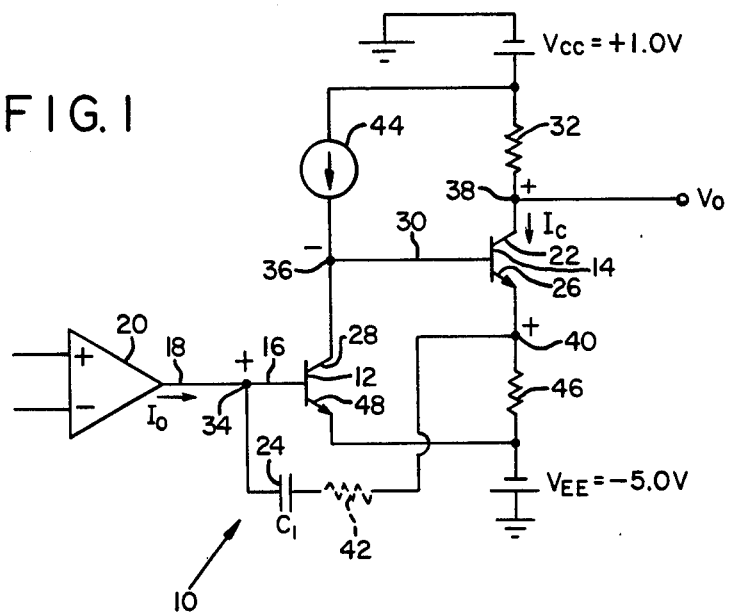
FIG. 1 is an electrical circuit schematic diagram of a first preferred embodiment of the frequency-compensated feedback amplifier in the single-ended input mode.

With reference to FIG. 1, the first preferred embodiment of the present invention is a single-ended input frequency-compensated amplifier 10 of the shunt-series feedback type that includes a pair of NPN transistors 12 and 14. The base terminal 16 of transistor 12 receives an input current signal, $I_o$, which flows from the output 18 of an amplifier 20. The collector terminal 22 of transistor 14 provides an output voltage signal, $V_o$, that is an amplified replica of the input current signal $I_o$. Amplifier 20 and transistors 12 and 14 constitute, respectively, a transconductance stage and an amplifier stage of amplifier 10.

Amplifier 10 is frequency compensated by a capacitor 24, which has a value $C_1$ and provides a path for a feedback current signal to flow from the emitter terminal 26 of transistor 14 to the base terminal 16 of transistor 12. Capacitor 24 is positioned in the amplifier circuit to accomplish two important objectives. First, capacitor 24 provides dominant pole compensation for amplifier 10 in a manner similar to that provided by Miller compensation. (Miller compensation would entail replacement of capacitor 24 with a capacitor positioned between the collector terminal 28 and the base terminal 16 of transistor 12.) Second, any residual portion of the input signal applied to base terminal 16 of transistor 12, feeding through capacitor 24, and flowing to collector terminal 22 of transistor 14 is substantially in-phase with the intended output signal produced by the input signal passing through transistors 12 and 14. In this configuration, collector terminal 22 and emitter terminal 26 represent an out-of-phase output and an in-phase output, respectively, of transistor 14 relative to the polarity of the signal flowing through base terminal 30 of transistor 14. Feedthrough of the input signal might occur at higher frequencies for which capacitor 24 forms a low impedance path from base terminal 16 of transistor 12 to emitter terminal 26 of transistor 14 and may be exploited to enhance the stability of amplifier 10. Capacitor 24 accomplishes both objectives of dominant pole compensation for intermediate frequencies and in-phase feedthrough of any residual portion of the input signal for the following reasons.

Amplifier 10 can be characterized in a first way for processing the feedback signal and in a second way for processing the residual portion of the input signal. With respect to the feedback signal, amplifier 10 can be characterized as including transistor 12 as an input transistor which provides an inverted amplified replica of the input current signal flowing through the collector terminal 28 of transistor 12, and transistor 14 as an output transistor which functions as an emitter follower. Capacitor 24 provides, therefore, a negative feedback path that introduces dominant pole compensation into the amplifier transfer function for intermediate frequencies.

With respect to the forward feedthrough of the residual portion of the input signal, amplifier 10 can be characterized as having a low impedance path through capacitor 24 from base terminal 16 of transistor 12 to emitter terminal 26 of transistor 14. (Transistor 14, which is configured as a common base amplifier for the residual portion of the input signal, has a low input impedance.) This provides a forward feedthrough path so that the residual portion of the input signal is substantially in phase with the output current signal that flows through collector 22 of transistor 14. The current flowing through collector 22 of transistor 14 develops an output voltage, $V_o$, across a load resistor 32. Capacitor 24 prevents, therefore, the formation of a right half plane zero that might cause amplifier 10 to become unstable and in some cases creates a left half plane zero. The creation of a left half plane zero may be exploited in some cases to enhance the stability of amplifier 10.

An examination of the signal polarities at various nodes in amplifier 10 relative to the polarity of the input current signal $I_o$ at base terminal 16 of transistor 12 demonstrates that the output signal $V_o$ and the residual portion of the input signal at emitter 26 of transistor 14 are in phase. In FIG. 1, the input current signal is assigned a positive polarity, which is represented by a "+" sign, at node 34. Transistor 12 inverts the input current signal to a negative polarity, which is represented by a "−" sign, at node 36. Transistor 14 inverts the signal appearing at node 36 to provide the output signal $V_o$ with a positive polarity at node 38, which is the output of amplifier 10. The residual portion of the input signal flows from node 34 through capacitor 24 and has a positive polarity at node 40. Transistor 14 does not invert the residual signal as it flows from node 40 to node 38. The residual signal and the amplified input signal arrive, therefore, substantially in phase at the output of amplifier 10. The above-described placement of capacitor 24 prevents the formation of a right half plane zero and, as a consequence, provides compensation with relatively large gain and phase margins, irrespective of the transconductance of transistor 12. The value $C_1$ of capacitor 24 can be expressed as:

$$C_1 = G_m / 2\pi f_{unity},$$

where $G_M$ is the effective transconductance of amplifier 20 and $f_{unity}$ is the frequency at which the magnitude of the loop gain is unity. In the first preferred embodiment, 4.0 pf, 2.5 millimhos, and 100 MHz are typical values for $C_1$, $G_m$, and $f_{unity}$, respectively. In some cases, a resistor 42, which is shown in phantom in FIG. 1, connected in series with capacitor 24 may enhance the compensation of amplifier 10. A typical value for resistor 42 would range between 50 ohms and 300 ohms.

In the first preferred embodiment, a constant-current source 44 determines the amount of bias current that flows through collector 28 of transistor 12. Amplifier 10 is designed to keep transistor 14 biased in the forward active region. This is accomplished by keeping $V_o$ greater than the voltage at node 36. The values of resistor 32 and resistor 46 are selected in conjunction with the values of bias voltage supplies $V_{EE}$ and $V_{CC}$ to provide the desired value of $V_o$ for the current, $I_C$, flowing through collector 18 of transistor 14. In this embodiment, the constant-current source 42 typically provides 1.0 milliampere of current, each of resistors 32 and 46 is 800 ohms, $I_c$ is 1.25 millamperes, $V_{CC} = +1.0$ volt and $V_{EE} = -5.0$ volts. The emitter 48 of transistor 12 is connected directly to $V_{EE}$. A typical value of phase margin for amplifier 10 would range between 45° and 90°.

Figure 2:
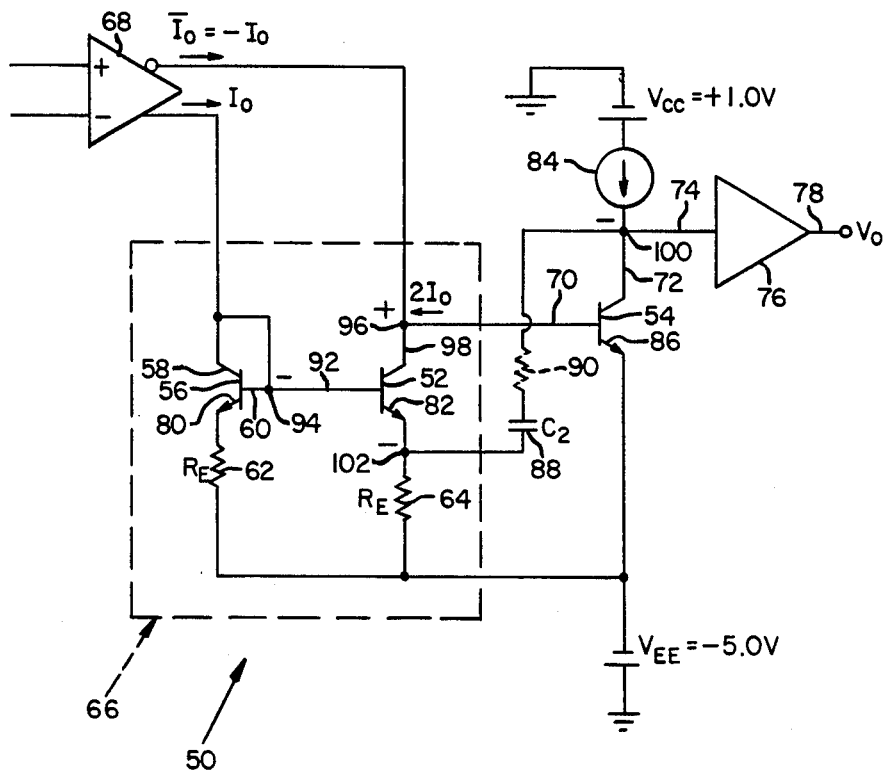
FIG. 2 is an electrical circuit schematic diagram of a second preferred embodiment of the frequency-compensated feedback amplifier in the differential-input mode.

With reference to FIG. 2, the second preferred embodiment of the present invention is a differential-input frequency-compensated amplifier 50 that includes a pair of NPN transistors 52 and 54. Transistor 52 and a transistor 56, whose collector terminal 58 and base terminal 60 are connected, together with degeneration resistors 62 and 64 form an inverting current amplifier or "current mirror" 66. Current mirror 66 receives a first output current, $I_o$, flowing from a differential amplifier 68, inverts the output current $I_o$, and adds it to a second output current, $\bar{I}_o$, flowing from differential amplifier 68. Differential amplifier 68 constitutes a transconductance stage of amplifier 50. The currents $I_o$ and $\bar{I}_o$ are of the same magnitude; therefore, a total output current of magnitude $2_I$ flows out of the base terminal 70 of transistor 54. Transistor 54 forms a high gain common-emitter amplifier whose collector terminal 72 drives the input 74 of a buffer amplifier 76, which is typically of unity voltage gain and provides a voltage signal, $V_o$, at its output 78. Transistor 54 constitutes an amplifier stage of amplifier 50, and amplifier 76 is an optional buffer which may be required to minimize the interaction between node 100 and a load impedance (not shown) electrically connected to it.

Transistors 52 and 56 constitute a current mirror of conventional design that provides an output current of an amount equal to $2I_o$. (This is true for transistors 52 and 56 whose $\beta$ values are the same and are relatively large, i.e., greater than 40.) Current mirror 66 converts the output currents $I_o$ and $\bar{I}_o$ of differential amplifier 68 to a single output current of twice the magnitude of either current. Resistor 62, which is connected to the emitter terminal 80 of transistor 56, and resistor 64, which is connected to the emitter 82 of transistor 52, receive the emitter bias voltage from the bias voltage supply, $V_{EE}$. In this embodiment, each of resistors 62 and 64 has a value $R_E$ of approximately 250 ohms which desensitizes current mirror 66 to the effects of the parasitic metal interconnect resistance of an integrated circuit in which amplifier 50 would be typically implemented, raises the output impedance of current mirror 66, and helps ensure that the gain of current mirror 66 is about $-1$.

The bias current flowing through collector terminal 72 of transistor 54 equals the current provided by a constant-current source 84. Constant-current source 84 is connected to the bias voltage supply, $V_{cc}$, and the emitter terminal 86 of transistor 54 is connected to the bias voltage supply, $V_{EE}$.

Amplifier 50 is frequency-compensated by a capacitor 88 which has a value $C_2$ and is connected between the collector terminal 72 of transistor 54 and the emitter terminal 82 of transistor 52. Capacitor 88 provides a feedback signal and accomplishes the objectives of dominant pole compensation for intermediate frequencies and in-phase feedthrough of any residual portion of the input signal with the amplified version of the input signal for the same reasons set forth with reference to capacitor 24 of the embodiment shown in FIG. 1. The value $C_2$ of capacitor 88 can be computed from the above expression for $C_1$ of amplifier 10, with the exception that $G_M$ represents the transconductance of differential amplifier 68. In the second preferred embodiment, 4.0 pf is a typical value for $C_2$. In some cases, a resistor 90, which is shown in phantom in FIG. 2, connected in series with capacitor 88 may enhance the compensation of amplifier 50. A typical value for resistor 90 would range between 50 ohms and 300 ohms.

An examination of the signal polarities at various nodes in amplifier 50 relative to the polarity of the input current signal at base terminal 92 of transistor 52 demonstrates that the output signal and the residual portion of the input signal are in phase at collector terminal 72 of transistor 54. In FIG. 2, the input current signal is assigned a negative polarity at node 94 that connects base terminal 60 of transistor 56 and base terminal 92 of transistor 52. Transistor 52 inverts the input signal to a positive polarity at node 96 of collector terminal 98 of transistor 52. Transistor 54 inverts the signal appearing at node 96 to provide an output signal with a negative polarity at node 100 of collector terminal 72 of transistor 54. The residual portion of the input signal appears at node 102 as a negative signal, flows through capacitor 88, and has a negative polarity at node 100. The residual signal and the amplified input signal are substantially in phase at node 100. The collector of transistor 52 provides at node 96 a high impedance signal path that produces a high degree of isolation between nodes 96 and 102.

Figure 3:
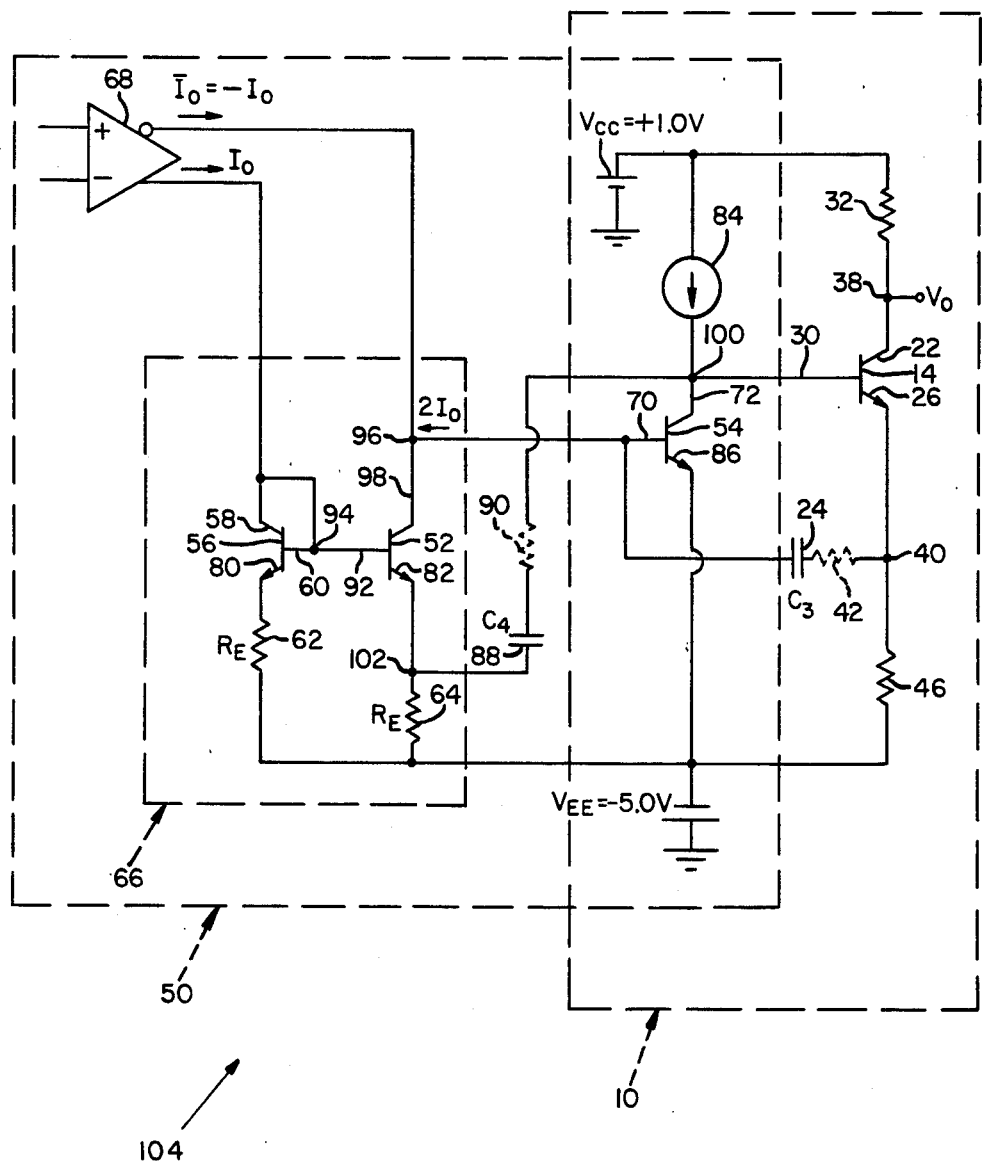
FIG. 3 is an electrical circuit schematic diagram of a third preferred embodiment that employs a combination of the compensation circuitry in the first and second embodiments of FIGS. 1 and 2, respectively.

With reference to FIG. 3, the third preferred embodiment of the present invention is a differential-input frequency-compensated amplifier 104 that constitutes a combination of the amplifiers 10 and 50 shown in FIGS. 1 and 2, respectively. Amplifier 104 is formed essentially by positioning amplifier 50 and amplifier 10 in cascade. The components corresponding to the respective amplifiers 10 and 50 are enclosed by rectangles formed from broken lines. An overlapping portion of amplifiers 10 and 50 includes constant-current source 84 and transistor 54, which are the reference numerals assigned to the components of amplifier 50. Constant-current source 84 and transistor 54 correspond to constant-current source 44 and transistor 12, respectively, of amplifier 10.

The values $C_3$ and $C_4$ of the respective capacitors 24 and 88 can be expressed as:

$$C_3 + C_4 = G_m / 2\pi f_{unity},$$

where $G_m$ is the effective transconductance of amplifier 68 and $f_{unity}$ is the frequency at which the magnitude of the loop gain is unity. In one implementation, $C_3 = C_4 = 2.0$ pf (but $C_3$ and $C_4$ need not have the same value), $G_m = 2.5$ millimhos, and $f_{unity} = 100$ MHz. In some cases, either one or both of resistors 42 and 90 connected in series with the respective capacitors 24 and 88 may enhance the compensation of amplifier 104.

It will be obvious to those having ordinary skill in the art that many changes may be made in the abovedescribed details of the preferred embodiments of the present invention without departing from the underlying principles thereof. For example, the amplifier can be implemented in GaAs FET, silicon MOSFET, or other device technologies. The scope of the present invention should be determined, therefore, only by the following claims.

I claim:

1. A frequency-compensated feedback amplifier, comprising:
    a transconductance stage;
    an amplifier stage having an input and an output, the amplifier stage receiving at its input a signal from the transconductance stage and amplifying the input signal to produce a signal at the output, said amplifier stage further comprising respective first and second biopolar transistors, the first biopolar transistor having an emitter terminal and a base terminal and the second bipolar transistor providing an output signal and having an emitter terminal and a collector terminal; and
    feedback means delivering to the input of the amplifier stage a feedback signal from said second biopolar transistor for compensating the amplifier, the feedback means including a reactive component and providing a feedthrough path to the output of the amplifier stage for any residual portion of the input signal so that the residual portion is substantially in phase with the output signal, thereby to provide an amplifier with relatively large phase and gain margins.

2. The amplifier of claim 1 in which the reactive component comprises a capacitor.

3. The amplifier of claim 2 in which the transconductance stage of the amplifier has an effective transconductance, $G_M$, and the capacitor has a value that equals $G_m/2\pi\ f_{unity}$, where $f_{unity}$ is the frequency at which the magnitude of the loop gain of the amplifier is unity.

4. The amplifier of claim 1 in which the second transistor has an out-of-phase output terminal on which the output signal appears and an in-phase output terminal from which the feedback signal originates, the reactive component being positioned between the in-phase output terminal of the second transistor and the input terminal of the first transistor.

5. The amplifier of claim 4 in which the reactive component comprises a capacitor.

6. The amplifier of claim 5 in which the feedback means further comprises a resistor in series with the reactive component.

7. The amplifier of claim 1 in which the first transistor has an input terminal on which the input signal appears and an in-phase output terminal which receives the feedback signal and the second transistor has an out-of-phase output terminal on which the output signal appears and from which the feedback signal originates, the reactive component being positioned between the out-of-phase terminal of the second transistor and the in-phase terminal of the first transistor.

8. The amplifier of claim 7 in which the reactive component comprises a capacitor.

9. The amplifier of claim 8 in which the feedback means further comprises a resistor in series with the reactive component.

10. The amplifier of claim 1 in which the feedback signal is received by the base terminal of the first transistor.

11. The amplifier of claim 1 in which the feedback signal is received by the emitter terminal of the first transistor.

12. The amplifier of claim 1 in which the feedback signal originates at the emitter terminal of the second transistor.

13. The amplifier of claim 1 in which the reactive component is positioned between the emitter terminal of the second transistor and the base terminals of the first transistor.

14. The amplifier of claim 1 in which the output signal appears on the collector terminal of the second transistor.

* * * * *